(12) United States Patent
Green et al.

(10) Patent No.: US 10,825,671 B2
(45) Date of Patent: Nov. 3, 2020

(54) ECHO CANCELLATION FOR TIME OF FLIGHT ANALOGUE TO DIGITAL CONVERTER

(71) Applicant: Micromass UK Limited, Wilmslow, Cheshire (GB)

(72) Inventors: Martin Raymond Green, Bowdon (GB); Frank Buckley, Warrington (GB); Garry Michael Scott, Wigan (GB); Anthony Gilbert

(73) Assignee: Micromass UK Limited, Wilmslow (GB)

( * ) Notice: Subject to any disclaimer, the term of this patent is extended or adjusted under 35 U.S.C. 154(b) by 0 days.

(21) Appl. No.: 16/422,363

(22) Filed: May 24, 2019

(65) Prior Publication Data

US 2019/0279852 A1 Sep. 12, 2019

Related U.S. Application Data

(63) Continuation of application No. 15/576,976, filed as application No. PCT/GB2016/051569 on May 27, 2016, now Pat. No. 10,354,850.

(30) Foreign Application Priority Data

May 28, 2015 (GB) .................................. 1509209.1

(51) Int. Cl.
*H01J 49/02* (2006.01)
*H03H 7/38* (2006.01)
(Continued)

(52) U.S. Cl.
CPC ...... *H01J 49/0036* (2013.01); *G06K 9/00503* (2013.01); *H01J 49/025* (2013.01);
(Continued)

(58) Field of Classification Search
CPC ............... H01J 49/0027; H01J 49/0031; H01J 49/0036; H01J 49/40; H01J 49/022;
(Continued)

(56) References Cited

U.S. PATENT DOCUMENTS 4,775,851 A 10/1988 Borth
6,586,728 B1 7/2003 Gavin et al.
(Continued)

FOREIGN PATENT DOCUMENTS

EP 1505631 A2 2/2005
EP 2621089 A1 7/2013
(Continued)

OTHER PUBLICATIONS

Hsue, Ching-Wen, "Elimination of Ringing Signals for a Lossless, Multiple-Section Transmission Line", IEEE Transactions on Microwave Theory and Techniques, vol. 37, No. 8, Aug. 1989 (Year: 1989).*

(Continued)

*Primary Examiner* — David E Smith
(74) *Attorney, Agent, or Firm* — Womble Bond Dickinson (US) LLP; Deborah M. Vernon; Heath T. Misley

(57) ABSTRACT

A method of mass spectrometry is disclosed comprising digitising a signal output from a detector to provide a first digitised signal. A finite impulse response ("FIR") filter, a digital filter or an echo cancellation filter is applied to the first digitised signal in order to reduce the effect of baseline perturbations, echoes or ringing effects. Alternatively, an analogue signal output from a detector is passed to one or more first power splitters or dividers, wherein one or more first transmission lines are attached to one or more ports of one more said first power splitters or dividers in order to reduce the effect of baseline perturbations, echoes or ringing effects.

20 Claims, 5 Drawing Sheets

(51) Int. Cl.
*H01J 49/00* (2006.01)
*G06K 9/00* (2006.01)
*H01J 49/40* (2006.01)
*H03H 17/02* (2006.01)
*H03H 17/06* (2006.01)

(52) U.S. Cl.
CPC .............. *H01J 49/40* (2013.01); *H03H 7/38* (2013.01); *H03H 17/0294* (2013.01); *H03H 17/06* (2013.01)

(58) Field of Classification Search
CPC ....... H01J 49/025; H03H 7/38; H03H 7/0294; H03H 7/06; H03H 17/0294; H03H 17/06; G06K 9/00503
See application file for complete search history.

(56) References Cited

U.S. PATENT DOCUMENTS

| | | | |
|---|---|---|---|
| 6,680,476 | B1 | 1/2004 | Hidalgo et al. |
| 7,884,317 | B2* | 2/2011 | Casper .................. H01J 49/025 250/281 |
| 2003/0047679 | A1* | 3/2003 | Cornish .............. H01J 49/0013 250/287 |
| 2003/0057370 | A1 | 3/2003 | Youngquist et al. |
| 2004/0144918 | A1* | 7/2004 | Zare ...................... H01J 49/061 250/287 |
| 2005/0006577 | A1* | 1/2005 | Fuhrer .................... H01J 49/40 250/287 |
| 2007/0252741 | A1 | 11/2007 | Hidalgo |
| 2007/0268171 | A1 | 11/2007 | Hidalgo et al. |
| 2009/0072134 | A1 | 3/2009 | Willis et al. |
| 2011/0186727 | A1* | 8/2011 | Loboda ............... H01J 49/0027 250/282 |
| 2012/0154190 | A1 | 6/2012 | Oonishi et al. |
| 2013/0080073 | A1 | 3/2013 | de Corral |
| 2013/0168546 | A1 | 7/2013 | Denny et al. |
| 2013/0181769 | A1* | 7/2013 | Noda .................. H01J 49/0036 327/551 |

FOREIGN PATENT DOCUMENTS

| | | |
|---|---|---|
| JP | 2013175845 A | 9/2013 |
| WO | 2003006949 A2 | 1/2003 |
| WO | 2007140327 A2 | 12/2007 |

OTHER PUBLICATIONS

Altera White Paper, Basic Principles of Signal Integrity, 2007 (Year: 2007).*
International Search Report and Written Opinion for International Application No. PCT/GB2016/051569, dated Aug. 11, 2016 and dated Oct. 10, 2016.
Search Report issued against United Kingdom Patent Application No. GB1509209.1, dated Jan. 20, 2016.
Combined Search and Examination Report issued in UK Application No. GB2004162.0 dated Aug. 3, 2020.

* cited by examiner

Fig. 4

| | |
|---|---|
| $b_0$ | 0 |
| $b_1$ | 0 |
| $b_2$ | 0 |
| $b_3$ | 143 |
| $b_4$ | 0 |
| $b_5$ | 0 |
| $b_6$ | 0 |
| $b_7$ | 0 |
| $b_8$ | 0 |
| $b_9$ | 0 |
| $b_{10}$ | -6 |
| $b_{11}$ | 0 |
| $b_{12}$ | -1 |
| $b_{13}$ | 0 |
| $b_{14}$ | 0 |
| $b_{15}$ | 0 |
| $b_{16}$ | -1 |
| $b_{17}$ | 0 |
| $b_{18}$ | -1 |
| $b_{19}$ | -5 |
| $b_{20}$ | 0 |
| $b_{21}$ | 0 |
| $b_{22}$ | 0 |
| $b_{23}$ | 0 |
| $b_{24}$ | 0 |
| $b_{25}$ | 0 |
| $b_{26}$ | 0 |
| $b_{27}$ | -1 |
| $b_{28}$ | 0 |
| $b_{29}$ | 0 |
| $b_{30}$ | 0 |
| $b_{31}$ | 0 |

ECHO CANCELLATION FOR TIME OF FLIGHT ANALOGUE TO DIGITAL CONVERTER

CROSS-REFERENCE TO RELATED APPLICATION

This application is a continuation of U.S. patent application Ser. No. 15/576,976, filed Nov. 27, 2017, which is the National Stage of International Application No. PCT/GB2016/051569, filed May 27, 2016, which claims priority from and the benefit of United Kingdom Patent Application No. 1509209.1, filed May 28, 2015. The entire contents of these applications are incorporated herein by reference.

FIELD OF THE INVENTION

The present invention relates generally to mass spectrometers and in particular to methods of Time of Flight mass spectrometry. Various embodiments relate to the processing of signals output from an ion detector which are then digitised by an analogue to digital converter ("ADC").

BACKGROUND

In an orthogonal acceleration Time of Flight mass spectrometer an analogue signal is created when ions are detected by an ion detector. Each analogue signal which corresponds with a single time of flight transient (i.e. the signal due to a single pulse of ions being detected by an ion detector which comprises an electron multiplier and wherein the signal is the result of a single pulse of ions being orthogonally accelerated into a time of flight or drift region of the Time of Flight mass spectrometer) is transmitted via a signal line to a data recording device such as an analogue to digital converter ("ADC"). The signal received by the analogue to digital converter is then digitised by the analogue to digital converter ("ADC") and the resulting digitised signal may then be further processed before being summed into memory together with other digitised signals corresponding to subsequent time of flight transients.

The signal line from the ion detector to the analogue to digital converter ("ADC") may include a number of different components including co-axial cables, co-axial connectors, xo-axial elbows, AC coupling devices, amplifiers, electrical discharge protection devices and attenuators.

It is known that small impedance mismatches in the signal line can give rise to reflections of the signal or echoes. Complex signal paths may comprise many small impedance mismatches and these reflections can appear as perturbations of the baseline signal which may appear in the baseline signal after the main ion signal pulse.

Perturbations in the baseline signal which appear after the main ion signal pulse may also be caused by parasitic capacitance effects which result in ringing effects appearing in the signal after the main ion signal pulse.

For given impedance mismatches the amplitude of the perturbations is directly proportional to the amplitude of the original signal.

In Time of Flight mass spectrometry these undesired perturbations in the baseline signal can result in unwanted artefacts appearing in a resultant mass spectrum or mass spectral data. Such undesired effects can be particularly problematic at high or relatively high ion flux.

EP-1505631 (Hidalgo) discloses a mass spectrometer comprising an ion accelerator, an ion detector and a finite impulse response ("FIR") filter. The output of the finite impulse response filter is a single value that exits the filter at a time delay which is characteristic of the flight time of the ions. The magnitude of the value which is output by the filter is proportional to the number of electrons generated by the ions having that flight time.

U.S. Pat. No. 6,680,476 (Hidalgo) discloses using a finite impulse response ("FIR") filter to match the shape of a mass peak.

WO 03/006949 (Youngquist) discloses using a digital filter comprising a finite impulse response ("FIR") filter, wherein the filter has a Gaussian filter function so as to match the shape of an ion peak.

US 2013/0168546 (Micromass) discloses using a finite impulse response ("FIR") filter comprising a single or double differential filter or a sharpening filter to extract information relating to the ion arrival time and intensity. The finite impulse response filter may be used to improve the identification and sharpening of ion peaks.

WO 2007/140327 (Waters) discloses using a finite impulse response ("FIR") filter for smoothing and differentiating signal peaks. The filter may have a Gaussian profile.

It is desired to provide an improved method of mass spectrometry.

SUMMARY

According to an aspect there is provided a method of mass spectrometry comprising:
digitising a signal output from a detector to provide a first digitised signal; and
applying a finite impulse response ("FIR") filter, a digital filter or an echo cancellation filter to the first digitised signal in order to reduce the effect of baseline perturbations, echoes or ringing effects.

The finite impulse response filter, digital filter or echo cancellation filter may comprise, be programmed to have or otherwise have associated with it a plurality of filter coefficients. The step of applying the finite impulse response filter, digital filter or the echo cancellation filter to the first digitised signal may further comprise setting or programming the filter coefficients so as substantially to match expected or observed perturbations, echoes or ringing effects. The filter coefficients may be set in dependence upon the amplitude and/or position of baseline perturbations, echoes or ringing effects which are either present or expected to be present in the first digitised signal.

This approach according to various embodiments is quite distinct from other known arrangements wherein a mass spectrometer may be coupled to a finite impulse response ("FIR") filter. For example, the finite impulse response ("FIR") filter which is utilised in the approach disclosed in EP-1505631 (Hidalgo) outputs a single value which is proportional to the number of electrons generated by ions having a particular flight time.

Accordingly, EP-1505631 (Hidalgo) does not disclose applying a finite impulse response ("FIR") filter to a digitised signal output from an ion detector in order to reduce the effect of baseline perturbations, echoes or ringing effects. Furthermore, EP-1505631 (Hidalgo) does not disclose setting or programming a plurality of filter coefficients of the finite impulse response ("FIR") filter, digital filter or an echo cancellation filter so as substantially to match observed or predicted baseline perturbations, echoes or ringing effects.

U.S. Pat. No. 6,680,476 (Hidalgo) discloses using a finite impulse response ("FIR") filter to match the shape of a mass peak. Accordingly, U.S. Pat. No. 6,680,476 (Hidalgo) does not disclose applying a finite impulse response ('FIR') filter to a digitised signal output from an ion detector in order to reduce the effect of baseline perturbations, echoes or ringing effects. Furthermore, U.S. Pat. No. 6,680,476 (Hidalgo) does not disclose setting or programming a plurality of filter coefficients of the finite impulse response ("FIR") filter, digital filter or an echo cancellation filter so as substantially to match observed or predicted baseline perturbations, echoes or ringing effects.

WO 03/006949 (Youngquist) discloses using a digital filter comprising a finite impulse response ("FIR") filter, wherein the filter has a Gaussian filter function so as to match the shape of an ion peak. Accordingly WO 03/006949 (Youngquist) does not disclose applying a finite impulse response ("FIR") filter to a digitised signal output from an ion detector in order to reduce the effect of baseline perturbations, echoes or ringing effects. Furthermore, WO 03/006949 (Youngquist) does not disclose setting or programming a plurality of filter coefficients of the finite impulse response ("FIR") filter, digital filter or an echo cancellation filter so as substantially to match observed or predicted baseline perturbations, echoes or ringing effects.

US 2013/0168546 (Micromass) discloses using a finite impulse response ("FIR") filter comprising a single or double differential filter or a sharpening filter to extract information relating to the ion arrival time and intensity. The finite impulse response filter is used to improve the identification and sharpening of ion peaks. Accordingly US 2013/0168546 (Micromass) does not disclose applying a finite impulse response ("FIR") filter to a digitised signal output from an ion detector in order to reduce the effect of baseline perturbations, echoes or ringing effects. Furthermore, US 2013/0168546 (Micromass) does not disclose setting or programming a plurality of filter coefficients of the finite impulse response ("FIR") filter, digital filter or an echo cancellation filter so as substantially to match observed or predicted baseline perturbations, echoes or ringing effects.

WO 2007/140327 (Waters) discloses using a finite impulse response ("FIR") filter for smoothing and differentiating signal peaks. The filter may have a Gaussian profile. The finite impulse response filter is used to improve the identification and sharpening of ion peaks. Accordingly WO 2007/140327 (Waters) does not disclose applying a finite impulse response ("FIR") filter to a digitised signal output from an ion detector in order to reduce the effect of baseline perturbations, echoes or ringing effects. Furthermore, WO 2007/140327 (Waters) does not disclose setting or programming a plurality of filter coefficients of the finite impulse response ('FIR') filter, digital filter or an echo cancellation filter so as substantially to match observed or predicted baseline perturbations, echoes or ringing effects.

The baseline perturbations, echoes or ringing effects may be caused by impedance mismatches in a signal path and/or by parasitic capacitance.

The baseline perturbations, echoes or ringing effects may be at a fixed, known or predictable time and/or position relative to one or more ion peaks or one or more signal peaks. In particular, the observed or predicted baseline perturbations, echoes or ringing effects may be observed or may be predicted to appear at a subsequent time to that of the one or more ion peaks or one or more signal peaks.

The baseline perturbations, echoes or ringing effects may have a fixed, known or predictable amplitude or intensity relative to one or more ion peaks or one or more signal peaks.

The step of applying a finite impulse response filter, digital filter or an echo cancellation filter to the first digitised signal in order to reduce the effect of baseline perturbations, echoes or ringing effects may be arranged so as to produce a second digitised signal.

Any baseline perturbations, echoes or ringing effects still present in the second digitised signal may be substantially reduced relative to corresponding baseline perturbations, echoes or ringing effects present in the first digitised signal.

The method may further comprise summing multiple second digitised signals from subsequent acquisitions so as to produce a mass spectrum or other form of composite mass spectral data.

The method may further comprise processing the second digitised signal(s).

The step of processing the second digitised signal(s) may comprise reducing the second digitised signal(s) to, for example, time and intensity pairs. For example, an ion peak having an approximately Gaussian profile centred at time $t_1$ and having an intensity of $I_1$ at time $t_1$ may be reduced or rendered as a time and intensity pair $t_1 I_1$.

The method may further comprise splitting the signal output from the detector or ion detector into at least a first signal and a second signal, wherein the first signal passes along a first signal path having a first gain and the second signal passes along a second signal path having a second different gain.

The method may further comprise digitising the first and second signals and combining the first and second signals so as to produce the first digitised signal.

The finite impulse response filter, digital filter or the echo cancellation filter may not substantially change the shape and/or width of one or more ion peak(s) or one or more signal peak(s) present in the signal(s) output from the detector.

The finite impulse response filter, digital filter or the echo cancellation filter may be arranged to change or alter the baseline by, for example, reducing baseline perturbations, echoes or ringing effects at one or more positions which are substantially remote from, distal to or subsequent in time to the position of one or more ion peaks or one or more signal peaks present in the signal output from the ion detector.

The method may further comprise using an Analogue to Digital Converter ("ADC") or another form of digitiser to digitise or otherwise sample the signal output from the ion detector.

The method may further comprise directing ions on to the detector, wherein the detector comprises an ion detector of a Time of Flight mass analyser.

According to another aspect there is provided a mass spectrometer comprising: a detector;
a first device arranged and adapted to digitise a signal output from the detector to provide a first digitised signal; and a finite impulse response ("FIR") filter, digital filter or an echo cancellation filter which is arranged and adapted or otherwise programmed to filter the first digitised signal in order to reduce the effect of baseline perturbations, echoes or other signal distortion(s).

The first device may comprise an Analogue to Digital Converter ("ADC").

The detector may comprise an ion detector of a Time of Flight mass analyser.

According to another aspect there is provided a method of mass spectrometry comprising:
passing a signal output from a detector to one or more first power splitters or dividers, wherein one or more first transmission lines are attached to one or more ports of one or more of the first power splitters or dividers (optionally in order to reduce the effect of baseline perturbations, echoes or other distortions); and processing a signal output from the one or more first power splitters or dividers.

A length of the one or more first transmission lines may be set to a length so as to reduce or cancel out baseline perturbations, echoes or ringing effects.

The one or more first transmission lines may have a length selected to reduce baseline perturbations, echoes or ringing effects at a fixed, known or predictable time and/or position relative to one or more ion peaks or one or more signal peaks.

The one or more first transmission lines may have a termination impedance selected or arranged so as to reduce baseline perturbations, echoes or ringing effects having a fixed, known or predictable amplitude relative to one or more ion peaks or one or more signal peaks.

The method may further comprise providing one or more second power splitters or dividers, wherein the one or more second power splitters or dividers are attached to the one or more first transmission lines.

The method may further comprise providing one or more second transmission lines attached to one or more ports of the one or more second power splitters or dividers.

The one or more second transmission lines may have a length selected to reduce baseline perturbations, echoes or ringing effects at a fixed, known or predictable time and/or position relative to one or more ion peaks or one or more signal peaks.

The one or more second transmission lines may have a termination impedance selected to reduce baseline perturbations, echoes or ringing effects having a fixed, known or predictable amplitude relative to one or more ion peaks or one or more signal peaks.

The method may further comprise using an Analogue to Digital Converter ("ADC") to digitise the signal output from the one or more first power splitters or dividers or using a Time to Digital Converter ("TDC") or other event counter to process the signal output from the one or more first power splitters or dividers.

The method may further comprise directing ions on to the detector, wherein the detector comprises an ion detector of a Time of Flight mass analyser.

According to another aspect there is provided a mass spectrometer comprising: a detector;
one or more first power splitters or dividers;
one or more first transmission lines attached to one or more ports of the one or more first power splitters or dividers in order to reduce the effect of baseline perturbations, echoes or ringing effects; and a device for processing a signal output from the one or more first power splitters or dividers;
wherein, in use, a signal output from the detector is passed to the one or more first power splitters or dividers.

The device for processing a signal output from the one or more first power splitters or dividers may comprise an Analogue to Digital Converter ("ADC") (or other form of digitiser) or a Time to Digital Converter ("TDC") (or other form of event counter).

The detector may comprise an ion detector of a Time of Flight mass analyser.

According to another aspect there is provided a method of mass spectrometry comprising:
digitising a signal output from a detector to provide a first digitised signal; and applying a digital filter or an echo cancellation filter to the first digitised signal in order to reduce the effect of baseline perturbations, echoes or ringing effects.

The digital filter or echo cancellation filter may comprise a finite impulse response ("FIR") filter.

According to another aspect there is provided a mass spectrometer comprising: a detector;
a first device arranged and adapted to digitise a signal output from the detector to provide a first digitised signal; and a digital filter or an echo cancellation filter which is arranged and adapted or otherwise programmed to filter the first digitised signal in order to reduce the effect of baseline perturbations, echoes or ringing effects.

The digital filter or echo cancellation filter may comprise a finite impulse response ("FIR") filter.

According to another aspect there is provided a method of mass spectrometry comprising:
producing a first signal from ions arriving at a detector;
producing a copy of the first signal; and
subtracting the copy (of the first signal) from the first signal in order to produce a second signal in order to (or so as to) reduce the effect of baseline perturbations, echoes or ringing effects.

The copy may be delayed in time.
The copy may be scaled in amplitude.

According to another aspect there is provided a mass spectrometer comprising: a detector arranged and adapted to produce a first signal when ions arrive at the detector;
a device arranged and adapted or programmed to produce a copy of the first signal; and
a device arranged and adapted or programmed to subtract the copy from the first signal so as to produce a second signal in order to reduce the effect of baseline perturbations, echoes or ringing effects.

The copy may be delayed in time.
The copy may be scaled in amplitude.

The various embodiments allow reduction of one or more perturbations and/or one or more echoes and/or one or more ringing effects in the baseline of a signal occurring after a signal from an ion detector (e.g. an ion signal peak) wherein the one or more perturbations and/or one or more echoes and/or one or more ringing effects in the baseline are caused by, for example, impedance mismatches or other distortions in a signal line between the ion detector and a signal processor such as an ADC (or other digitiser) or a TDC (or other event counter). The various embodiments are particularly beneficial in terms of reducing or substantially eliminating artefacts or other spurious ion peaks which might otherwise appear in a final mass spectrum or other composite mass spectral data set.

According to various embodiments an intensity scaled copy of a digitised signal may be shifted by an integer number of digitisation bins and summed with the original digitised data.

According to other embodiments an equivalent analogue method of echo cancellation may be utilised.

According to an aspect there is provided a method of time of flight mass spectrometry comprising:
(a) digitising the signal output from a detector to produce a first digitised signal;
(b) applying a finite impulse response ("FIR") filter or an echo cancellation filter to the digitised signal to produce a second digitised signal where the FIR filter coefficients depend on the amplitude and position of baseline perturbations, echoes or ringing effects relative to the signal from the output of the detector, and (c) summing multiple second filtered digitised signals from subsequent individual time of flight separations to produce a mass spectrum, wherein the mass spectrum exhibits reduced artifact signals caused by impedance mismatches in the signal path.

The digitised signal may be further processed after filtering and prior to summation.

The digitised signal may be reduced to time and intensity pairs after filtering and before summation.

The signal may be directed via two or more signal paths with different gains to two or more digitisers prior to filtering and the signals may be combined to produce a high dynamic range spectrum.

The FIR filter, digital filter or echo cancellation filter optionally does not substantially change the shape or width of the ion signal output from the detector.

The FIR filter, digital filter or echo cancellation filter optionally acts to change the baseline of a signal at a position remote from (e.g. subsequent in time to) the ion signal output from the detector.

According to an embodiment the mass spectrometer may further comprise:

(a) an ion source selected from the group consisting of: (i) an Electrospray ionisation ("ESI") ion source; (ii) an Atmospheric Pressure Photo ionisation ("APPI") ion source; (Ill) an Atmospheric Pressure Chemical ionisation ("APCI") ion source; (iv) a Matrix Assisted Laser Desorption ionisation ("MALDI") ion source; (v) a Laser Desorption ionisation ("LDI") ion source; (vi) an Atmospheric Pressure ionisation ("API") ion source; (vii) a Desorption ionisation on Silicon ("DIOS") ion source; (viii) an Electron Impact ("EI") ion source; (ix) a Chemical ionisation ("CI") ion source; (x) a Field ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray ionisation ("DESI") ion source; (xvi) a Nickel-63 radioactive ion source; (xvii) an Atmospheric Pressure Matrix Assisted Laser Desorption ionisation ion source; (xviii) a Thermospray ion source; (xix) an Atmospheric Sampling Glow Discharge ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray ionisation ("LSI") ion source; (xxiv) a Sonicspray ionisation ("SSI") ion source; (xxv) a Matrix Assisted Inlet ionisation ("MAII") ion source; (xxvi) a Solvent Assisted Inlet ionisation ("SAII") ion source; (xxvii) a Desorption Electrospray ionisation ("DESI") ion source; and (xxviii) a Laser Ablation Electrospray ionisation ("LAESI") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser (v) an ion trap mass analyser; (vi) a magnetic sector mass analyser; (vii) ion Cyclotron Resonance ("ICR") mass analyser; (viii) a Fourier Transform Ion Cyclotron Resonance ("FTICR") mass analyser; (ix) an electrostatic mass analyser arranged to generate an electrostatic field having a quadro-logarithmic potential distribution; (x) a Fourier Transform electrostatic mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter; and/or (k) a device or ion gate for pulsing ions; and/or (l) a device for converting a substantially continuous ion beam into a pulsed ion beam.

The mass spectrometer may further comprise either:

(i) a C-trap and a mass analyser comprising an outer barrel-like electrode and a coaxial inner spindle-like electrode that form an electrostatic field with a quadro-logarithmic potential distribution, wherein in a first mode of operation ions are transmitted to the C-trap and are then injected into the mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

According to an embodiment the mass spectrometer further comprises a device arranged and adapted to supply an AC or RF voltage to the electrodes. The AC or RF voltage optionally has an amplitude selected from the group consisting of: (i) about <50 V peak to peak; (ii) about 50-100 V peak to peak; (III) about 100-150 V peak to peak; (iv) about 150-200 V peak to peak; (v) about 200-250 V peak to peak; (vi) about 250-300 V peak to peak; (vii) about 300-350 V peak to peak; (viii) about 350-400 V peak to peak; (ix) about 400-450 V peak to peak; (x) about 450-500 V peak to peak; and (xi) > about 500 V peak to peak.

The AC or RF voltage may have a frequency selected from the group consisting of: (i) < about 100 kHz; (ii) about 100-200 kHz; (iii) about 200-300 kHz; (iv) about 300-400 kHz; (v) about 400-500 kHz; (vi) about 0.5-1.0 MHz; (vii) about 1.0-1.5 MHz; (viii) about 1.5-2.0 MHz; (Ix) about 2.0-2.5 MHz; (x) about 2.5-3.0 MHz; (xi) about 3.0-3.5 MHz; (xii) about 3.5-4.0 MHz; (xiii) about 4.0-4.5 MHz; (xiv) about 4.5-5.0 MHz; (xv) about 5.0-5.5 MHz; (xvi) about 5.5-6.0 MHz; (xvii) about 6.0-6.5 MHz; (xviii) about 6.5-7.0 MHz; (xix) about 7.0-7.5 MHz; (xx) about 7.5-8.0 MHz; (xxi) about 8.0-8.5 MHz; (xxii) about 8.5-9.0 MHz; (xxiii) about 9.0-9.5 MHz; (xxiv) about 9.5-10.0 MHz; and (xxv) > about 10.0 MHz.

The mass spectrometer may also comprise a chromatography or other separation device upstream of an ion source. According to an embodiment the chromatography separation device comprises a liquid chromatography or gas chromatography device. According to another embodiment the separation device may comprise: (i) a Capillary Electrophoresis ("CE") separation device; (ii) a Capillary Electrochromatography ("CEC") separation device; (iii) a substantially rigid ceramic-based multilayer microfluidic substrate ("ceramic tile") separation device; or (iv) a supercritical fluid chromatography separation device.

The ion guide may be maintained at a pressure selected from the group consisting of: (i) < about 0.0001 mbar; (ii) about 0.0001-0.001 mbar; (iii) about 0.001-0.01 mbar; (iv) about 0.01-0.1 mbar; (v) about 0.1-1 mbar; (vi) about 1-10 mbar; (vii) about 10-100 mbar; (viii) about 100-1000 mbar; and (ix) > about 1000 mbar.

BRIEF DESCRIPTION OF THE DRAWINGS

Various embodiments will now be described, by way of example only, and with reference to the accompanying drawings in which:

FIG. 4 shows the 32 coefficients of the 32 tap digital delay line filter which was used according to an embodiment in order to obtain the improved digitised signal as shown in FIG. 3;

DETAILED DESCRIPTION

Figure 1:
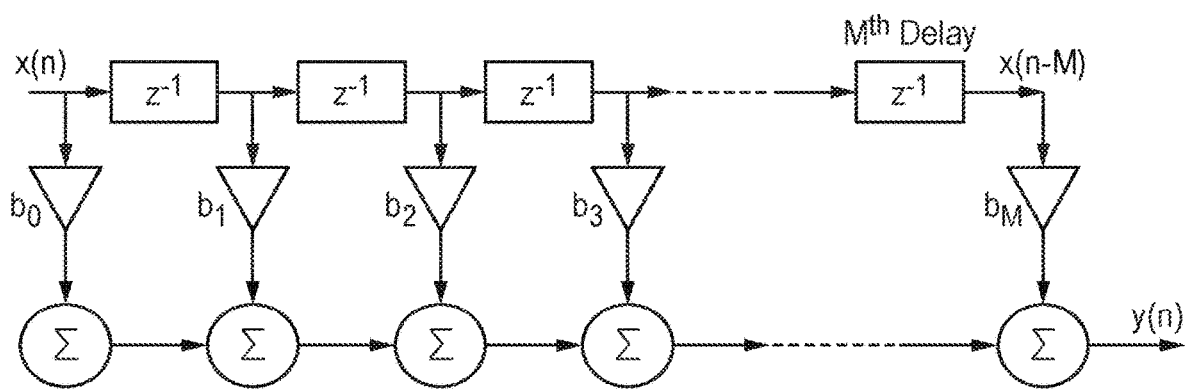
FIG. 1 shows a generalised schematic of a tapped delay line filter.

Various embodiments will be described in more detail below and relate generally to the processing of signals output from an ion detector arranged as a detector in, for example, an orthogonal acceleration Time of Flight mass spectrometer or mass analyser.

The orthogonal acceleration mass spectrometer or mass analyser may comprise an ion pusher or acceleration device which is arranged to orthogonally accelerate ions into a time of flight or drift region of the mass spectrometer. Ions which have been orthogonally accelerated into the time of flight or drift region of the mass spectrometer may then be reflected by an ion mirror before the ions impinge upon an ion detector or are otherwise detected by an ion detector. The ion detector may comprise an electron multiplier.

The time of flight of the ions passing through the time of flight or drift region of the mass spectrometer may then be determined and a resulting mass spectrum or mass spectral data may be obtained by combining the signals from multiple ion acceleration events.

Each ion acceleration event will generate a single time of flight transient which may comprise an ion peak or a signal peak superimposed upon a baseline signal.

The ion detector which is arranged to detect the ions after the ions have passed through the time of flight or drift region may be coupled to an analogue to digital converter ("ADC") which may be arranged to digitise the signal output from the ion detector. The analogue to digital converter may be arranged to digitise each time of flight transient output by the ion detector.

The signal line from the ion detector to the analogue to digital converter ("ADC") may comprise a number of different individual components including co-axial cables, co-axial connectors, co-axial elbows, AC coupling devices, amplifiers, electrical discharge protection devices and attenuators.

The analogue signal created when ions associated with a single time of flight transient (i.e. due to a single orthogonal acceleration push) strike an electron multiplier may be transmitted via the signal line to a data recording device such as an analogue to digital converter ("ADC"). The signal may be digitised by the analogue to digital converter ("ADC") and the digitised signal may then be further processed before being summed into memory with signals from subsequent time of flight transients.

Small Impedance mismatches in the signal line from the ion detector to the analogue to digital converter can give rise to reflections of the signal (i.e. echoes). With complex signal paths containing many small Impedance mismatches these reflections may appear as perturbations of the baseline signal with the result that perturbations in the baseline signal may appear after the main ion signal pulse or signal peak. In particular, the perturbations in the baseline signal may appear as ringing effects which are located or otherwise appear in time after the main ion signal pulse or signal peak.

Perturbations in the baseline which appear after the main ion signal pulse may also be caused by parasitic capacitance which can result in ringing effects appearing after the ion signal pulse.

For given impedance mismatches the amplitude of the perturbations is directly proportional to the amplitude of the original signal.

In Time of Flight mass spectrometry these perturbations in the baseline can result in unwanted or undesired artefacts (or false ion peaks) appearing in the resultant mass spectrum or mass spectral data. This problem can be particularly significant at high ion flux.

According to various embodiments a finite impulse response ('FIR') filter, digital filter or an echo cancellation filter may be utilised wherein the finite Impulse response ("FIR") filter, digital filter or the echo cancellation filter is programmed or otherwise set so as to reduce the effect of baseline perturbations, echoes or ringing effects which would otherwise appear in a time of flight transient after the main ion signal pulse or peak. Such an approach is in contrast to other known approaches wherein a finite impulse response filter is used to improve the smoothness of a detected ion peak or signal peak (but not to reduce distortions in the baseline after a detected ion peak).

In particular, according to various embodiments the finite impulse response ("FIR") filter, digital filter or echo cancellation filter which is used may be arranged to have (or may otherwise be programmed to have) a number of filter coefficients, wherein the filter coefficients may be matched to perturbations, echoes or ringing effects in the baseline of a signal. In particular, the filter coefficients may be programmed or otherwise set so as to reduce, minimise or essentially eliminate perturbations, echoes or ringing effects in a time of flight transient which may be caused by impedance mismatches in a signal path between the ion detector and a digitiser such as an analogue to digital converter and/or perturbations, echoes or ringing effects in a time of flight transient which may be caused by parasitic capacitance.

The one or more filter coefficients may be set or programmed in dependence upon the amplitude and/or position of baseline perturbations, echoes or ringing effects which may be observed or predicted in digitised signals output from the ion detector. The one or more filter coefficients may be pre-determined and/or may be set or altered dynamically.

The undesired baseline perturbations, echoes or ringing effects which are desired to be reduced or eliminated may be observed at a fixed, known or predictable time and/or position relative to one or more main ion peaks or signal peaks which may appear, for example, in a single time of flight transient.

The undesired baseline perturbations, echoes or ringing effects may have a fixed, known or predictable amplitude relative to one or more main ion peaks or signal peaks.

Applying a finite impulse response filter, digital filter or an echo cancellation filter to the digitised signal output from the ion detector and associated analogue to digital converter may result in a second (improved) digitised signal being produced or otherwise being output. The second digitised signal may be further processed. For example, according to various embodiments an improved second digitised signal may be reduced to time and intensity pairs (i.e. an ion peak may be reduced to a single intensity value and a corresponding single time or mass to charge ratio value).

According to various embodiments a small degree or a reduced amount of baseline perturbation may still present in some of the second (nonetheless improved) digitised signals. However, any baseline perturbations, echoes or ringing effects which may still be present in the second digitised signals will still be substantially reduced relative to corresponding baseline perturbations, echoes or ringing effects which are present in the first digitised signal and which would otherwise be present in the final signal which is then further processed.

Accordingly, various embodiments relate to at least reducing the effects of unwanted baseline perturbations, echoes or ringing effects present in ion signals or time of flight transients and especially undesired perturbations, echoes or ringing effects which may appear in time subsequent to that of the main ion signal or signal peak. Various embodiments are contemplated which essentially substantially remove all the effects of unwanted baseline perturbations, echoes or ringing effects present in ion signals which appear subsequent to that of the main ion signal or signal peak.

The application of a finite impulse response ("FIR") filter, digital filter or an echo cancellation filter in the manner described according to various embodiments and wherein the finite Impulse response ("FIR") filter, digital filter or echo cancellation filter is set or programmed to have filter coefficients which are dependent upon the amplitude and/or position of undesired baseline perturbations, echoes or ringing effects (optionally relative to the amplitude and/or position of desired ion peaks) enables unwanted baseline perturbations, echoes or ringing effects which would otherwise appear in digitisation samples from a signal following ion arrivals at an ion detector to be reduced or substantially removed.

The application of the finite impulse response ("FIR") filter, digital filter or echo cancellation filter according to various embodiments beneficially does not substantially affect the intensity, shape or width of the signal due to ion arrival events at the ion detector (i.e. the application of the finite impulse response ("FIR") filter, digital filter or an echo cancellation filter does not affect or alter the preceding ion signal or ion peak which Is due to ions impinging upon the ion detector). In summary, various arrangements are known which filter the ion signal peak but which do not filter any subsequent undesired perturbations in the baseline signal. In contrast, the present embodiments relate to a filter which removes undesired perturbations in the baseline signal subsequent to an ion signal peak but which does not (necessarily) filter the ion signal peak.

Other embodiments are, however, contemplated wherein the finite impulse response ("FIR") filter, digital filter or other form of filter may be arranged or other programmed both: (i) to filter out undesired perturbations in a baseline signal subsequent to an ion signal peak; and also (ii) to filter an ion signal peak by, for example, smoothing the ion signal peak and/or differentiating the ion signal peak.

In contrast to other pulse shaping filters which are generally matched to the single ion response, the filter or the filtering effects of the filter according to various embodiments may be spread over significantly more or a greater number of time bins in order to encompass reflections caused by impedance mismatches in the signal line downstream of the ion detector. For example, embodiments are contemplated wherein the finite impulse response filter or digital filter is arranged and adapted or otherwise programmed to filter the signal so that the resulting filtering effect is spread over at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 time bins.

The method may further comprise summing multiple second digitised signals (i.e. digitised signals which have been processed and improved by the finite impulse response ("FIR") filter, digital filter or echo cancellation filter) from subsequent acquisitions so as to produce a mass spectrum, composite mass spectrum or combined mass spectral data set or spectrum.

Embodiments are contemplated wherein the signal output from the ion detector may be split into at least a first signal and a second signal, wherein the first signal passes along a first signal path having a first gain and the second signal passes along a second signal path having a second different gain. The first and second signals may be separately digitised and then the digitised signals may be combined or otherwise stitched together (selectively or otherwise) so as to produce a first digitised signal which may then be filtered by the finite impulse response ("FIR") filter, digital filter or echo cancellation filter.

The finite impulse response filter or the echo cancellation filter may be arranged so that it does not substantially change the shape and/or width of genuine ion peaks present in the signal output from the ion detector.

The finite impulse response filter, digital filter or an echo cancellation filter may be arranged to change or alter the baseline optionally by reducing baseline perturbations, echoes or ringing effects at one or more positions which are substantially remote from the position of one or more ion peaks present in the signal output from the ion detector. In particular, the finite impulse response ("FIR") filter, digital filter or the echo cancellation filter may be arranged to process the baseline signal which appears after or subsequent in time to an ion peak in a single time of flight transient signal (or a plurality of summed time of flight transients).

FIG. 1 shows a generalised schematic of a tapped delay line filter of length M with coefficients from $b_0$ to $b_M$ according to an embodiment. The output of the filter is y(n) and $z^{-1}$ corresponds to a delay of one sample. The tapped delay line filter shown in FIG. 1 is a form of a finite impulse response ("FIR") filter, digital filter or echo cancellation filter. As will be discussed in more detail below, the coefficients $b_0$ to $b_A$ may be set (for example on a pre-determined or dynamic basis) or otherwise programmed in order to reduce the effect of undesired perturbations, echoes or ringing effects in the baseline signal and in particular to remove or at least minimise ringing or other effects due to impedance mismatches in the signal line. The filter coefficients may, in particular, be set or otherwise programmed in order to filter out distortions which may appear in a single time of flight transient subsequent to the main ion signal or ion peak (which is due to ions impacting an ion detector or otherwise being detected by the ion detector).

Figure 2:
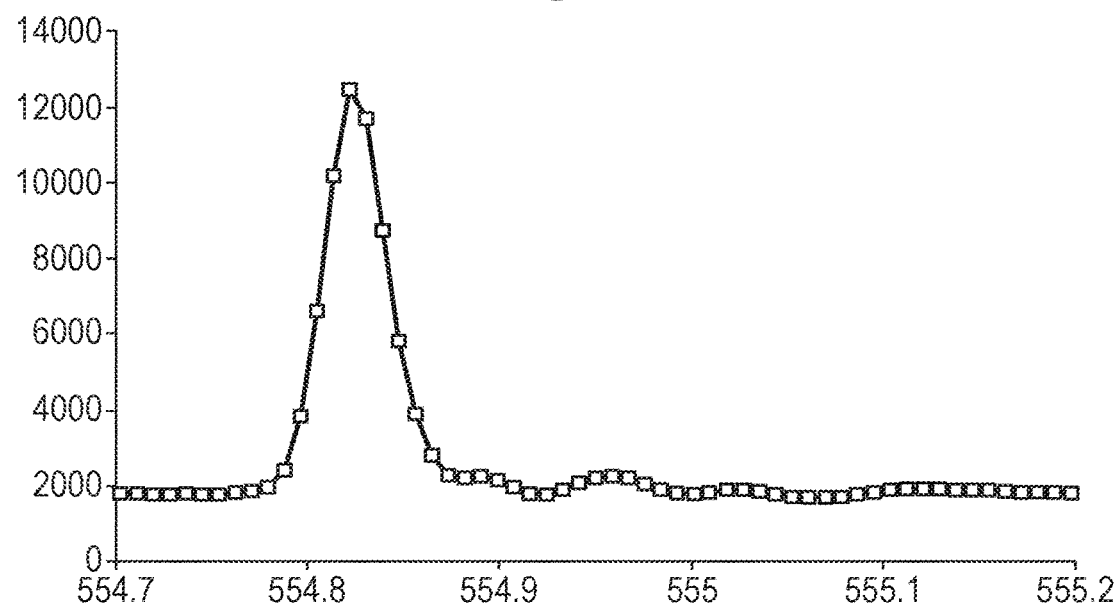
FIG. 2 shows an example of a digitised signal from a Time of Flight mass spectrometer showing perturbations present in the baseline after an ion peak.

FIG. 2 shows an example of a digitised signal which relates to an analogue signal output from an ion detector and which has been digitised by an analogue to digital converter ("ADC"). The ion detector may form part of a Time of Flight mass spectrometer and in particular the ion detector may comprise the detector system of an orthogonal acceleration Time of Flight mass spectrometer or mass analyser.

It will be apparent from FIG. 2 that perturbations in the baseline (which may arise from impedance mismatches in the signal line and/or parasitic capacitance effects) can be seen at longer flight times (higher apparent m/z values) than the roughly or approximately Gaussian response due to an ensemble of ions striking the ion detector.

The single time of flight transient shown in FIG. 2 results from approximately ten Ions of Leucine Enkephalin each having a mass to charge ratio (m/z) of 556.3 arriving substantially simultaneously at an ion detector as a result of a single pulse of ions being ejected or orthogonally accelerated into the time of flight region of a mass analyser. The time of flight transient was acquired or otherwise sampled using an eight bit 3 GHz analogue to digital converter ("ADC").

The flight time of the ions (each having a mass to charge ratio of m/z 556.3) was approximately 32 µs through the time of flight region of the orthogonal acceleration Time of Flight mass spectrometer. The signal output from the ion detector and which is a result of the ions impinging upon the ion detector has a FWHM of approximately 1.3 ns.

According to an embodiment a 32 tap digital delay line filter (i.e. a form of finite impulse response ("FIR") filter, digital filter or echo cancellation filter) may be used to filter the time of flight transient shown in FIG. 2.

According to an embodiment the coefficients of the finite impulse response ("FIR") filter or an echo cancellation filter may be set (e.g. on a predetermined or dynamic basis) so as to reduce or minimise the effect of unwanted baseline perturbations, echoes or ringing effects which otherwise appear after the ion signal or ion peak due to ion arrival events at the ion detector.

Figure 3:
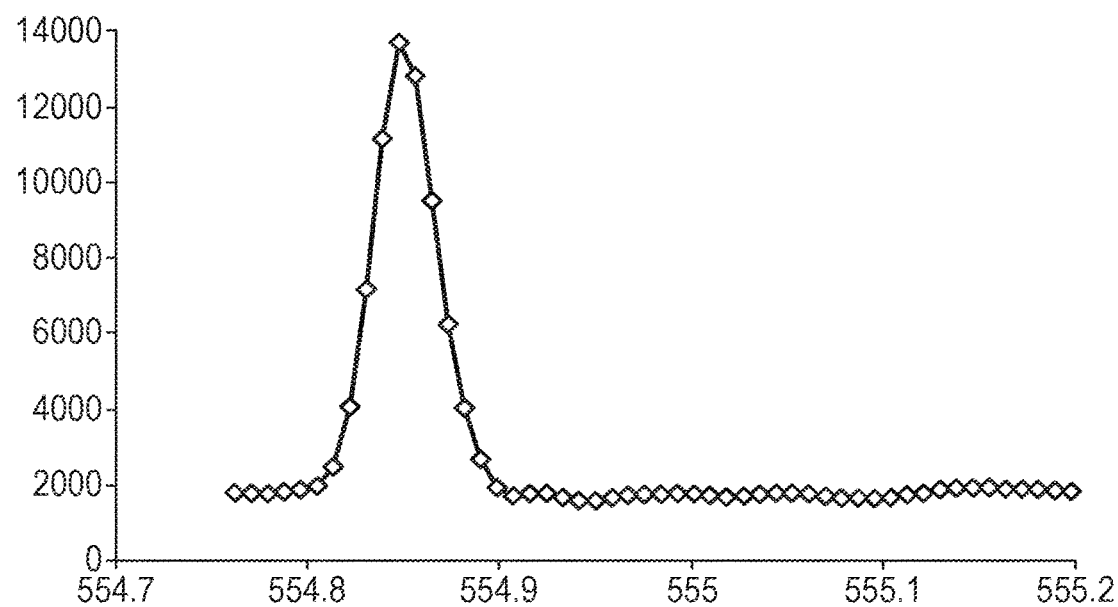
FIG. 3 shows an embodiment wherein a 32 tap digital delay line filter is applied to the data shown in FIG. 2 with the result that perturbations in the baseline after the ion peak are substantially reduced.

FIG. 3 shows a single time of flight transient which was obtained according to an embodiment wherein the output from an analogue to digital converter was filtered using a finite impulse response ("FIR") filter, digital filter or echo cancellation filter. It will be apparent from comparing the filtered ion signal as shown in FIG. 3 (which was obtained according to an embodiment) with the unfiltered signal shown in FIG. 2 that the effect of applying the finite impulses response ("FIR") filter, digital filter or an echo cancellation filter to a single time of flight transient can result in a significant reduction in undesired perturbations in the baseline. In particular, setting or programming a number of filter coefficients of the finite impulse response filter so as to filter the signal subsequent to the end of a signal peak due to ions being detected by the ion detector is particularly effective in removing distortions in the baseline which would otherwise appear after an ion signal or ion peak due to e.g. Impedance and/or capacitive mismatches in the signal line from the ion detector to the digitiser or analogue to digital converter ("ADC").

In particular, FIG. 3 shows an example of the improvement in the quality of a single time of flight transient which may be obtained by applying a 32 tap digital delay line filter to the uncorrected time of flight transient or other data as shown in FIG. 2.

It should be understood, however, that it is not essential that a 32 tap digital delay line filter is used to processed the digitised signal. For example, various other embodiments are contemplated wherein a digital delay line filter having at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 taps may be utilised.

FIG. 4 shows the 32 coefficients $b_0$-$b_3$, of a delay line filter, finite impulse response ("FIR") filter, digital filter or echo cancellation filter which were used according to an embodiment and in particular which were used to filter the single time of flight transient as shown in FIG. 2 so as to produce the improved time of flight transient as shown in FIG. 3.

It should be understood, however, that a different number of filter coefficients may be used and also that the values of each filter coefficient may differ from the values shown in FIG. 4. According to an embodiment a finite impulse response filter may be used which is arranged or otherwise programmed to have at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 or 50 different filter coefficients.

The filter coefficients may take either positive and/or negative values. According to an embodiment at least some of the filter coefficients may take a value which a range comprising: (i) <−200; (ii) −200 to −150; (iii) −150 to −100; (iv) −100 to −50; (v) −50 to −40; (vi) −40 to −30; (vii) −30 to −20; (viii) −20 to −10; (ix) −10 to 0; (x) 0-10; (xi) 10-20; (xii) 20-30; (xiii) 30-40; (xiv) 40-50; (xv) 50-100; (xvi) 100-150; (xvii) 150-200; and (xviii) >200.

In the particular case of the filter shown and described above with reference to FIG. 4, the intensity in each digitisation bin in the output of the filter was divided by 128 after application of the filter in order to rescale to the original intensity.

However, it should be understood that other embodiments are contemplated wherein the intensity in each digitisation bin in the output of the filter may be divided by a value other than 128 in order to rescale the original intensity.

Application of the finite impulse response filter, digital filter or the echo cancellation filter according to various embodiments may result in a significant reduction (or substantial elimination) in or of the perturbations, echoes or ringing effects which would otherwise be observed or be present in the baseline after an ion signal or ion peak due to ion arrival events at the ion detector. In particular, the undesired effects or distortions in the baseline due to impedance and/or capacitive mismatches in the signal line can be substantially addressed or resolved without altering or otherwise affecting the shape and/or intensity of the signal or ion peak due to ion arrival events at the ion detector. Accordingly, the finite impulse response filter, digital filter or echo cancellation filter according to various embodiments is able to selectively reduce or remove undesired perturbations in the baseline without having any effect (or at least any substantial effect) upon the main ion signal or ion peak.

Various different methods may be used to determine the coefficients of the filter which may be used to minimise the perturbations, echoes or ringing effects in the baseline after the signal peak(s). Methods of constructing adaptive filters with sophisticated optimisation algorithms are known and reference is made, for example, to Douglas, S. C. "Introduction to Adaptive Filters", Digital Signal Processing Handbook, Ed. Vijay K. Madisetti and Douglas B. Williams, Boca Raton: CRC Press LLC, 1999. The optimisation algorithms disclosed therein are hereby incorporated by reference and will be understood by those skilled in the art.

Those skilled in the art will be familiar with known methods such as those incorporated herein by reference above and which generally involve the calculation of a cost function or error function which is minimised in a closed loop process. An adaptive filter process may be used which attempts to minimise the error between the desired signal and the output of the filter.

In order to determine the coefficients of the filter, a calibration step may first be performed. The digitised response for ion arrivals or ion arrival events may first be recorded. Based upon this signal an estimated or calculated ideal response for an ion arrival event and the associated filter coefficients necessary for this to occur may be calculated either automatically using an iterative process as described above, for example, or alternatively may be manually determined by e.g. trial and error or other methods. Common types of adaptive filters which may be used include a least mean squares ("LMS") filter and a recursive least mean squares ("RLS") filter.

According to various embodiments discussed above a finite impulse response ("FIR") filter, digital filter or an echo cancellation filter may be applied to a digitised signal output from e.g. an analogue to digital converter ("ADC"). However, other embodiments are contemplated wherein a similar effect may be achieved using a power splitter or divider which may be arranged upstream of a digitiser, analogue to digital converter ("ADC"), time to digital converter ("TDC") or other event counter.

It should be understood, therefore, that various alternatives or equivalents to using a finite impulse response having a number of programmed coefficients which are set so as to minimise undesired baseline perturbations, echoes or ringing effects are intended to fall within the scope of the present invention.

A number of these alternative embodiments will now be described in more detail below.

According to an embodiment various analogue components may be used or arranged prior to digitisation so as to enable echo cancellation to be achieved without implementation of a digital filter. However, such an approach may result in a small degree of attenuation of the main signal or ion peak signal (i.e. the main ion peak in a time of flight transient which is due to ions hitting the ion detector or otherwise being detected by the ion detector).

Figure 5:
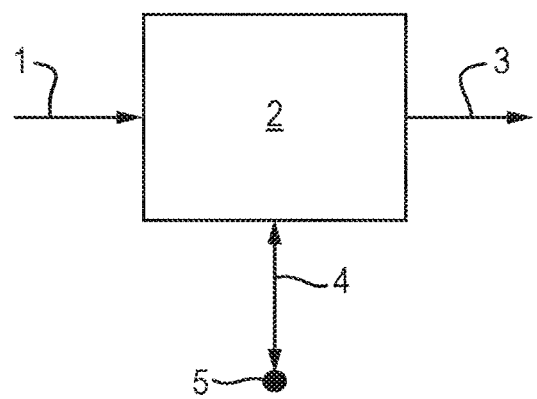
FIG. 5 shows a simple schematic of the components of an alternative embodiment which utilises a power splitter.

FIG. 5 shows a simple schematic of such an alternative embodiment comprising a power splitter 2. As will be understood, according to this alternative embodiment a finite impulse response filter does not need to be provided and indeed may not be provided. Instead, the power splitter 2 can be arranged to generate essentially a similar filtering effect upon an ion signal or time of flight transient output from an ion detector.

According to this embodiment an un-equal power splitter or divider 2 may be provided wherein the power splitter or divider 2 has an input 1. The input 1 to the power splitter or divider 2 may, for example, be arranged to receive an analogue output from an ion detector of a Time of Flight mass spectrometer or mass analyser. In particular, the Time of Flight mass spectrometer or mass analyser may comprise an orthogonal acceleration Time of Flight mass spectrometer or mass analyser. The analogue output from the ion detector may exhibit baseline perturbation effects due to impedance mismatches upstream of the power splitter or divider 2.

The use of a power splitter or power divider circuit 2 in the manner as shown and described in relation to FIG. 5 allows control of the impedance of all the junctions and enables unwanted signal reflections to be avoided or at least substantially minimised.

The output 3 from the power splitter 2 may be sent to an analogue to digital converter ("ADC") which may be arranged to sample or digitise the signal output from the power splitter or divider 2.

A length of transmission line 4 may be attached to a third port of the power splitter 2. The length of the transmission line 4 which is attached to the third port of the power splitter 2 may be arranged so as to determine the delay of an echo cancellation signal. The termination impedance 5 and the length of the transmission line 4 may be chosen such that the reflection of the part of the signal transmitted down the transmission line 4 substantially cancels out any perturbation in the baseline appearing at a time after the main ion signal (due to ions being detected by the ion detector) and may be arranged to equal the transit or propagation of the signal along twice the length of transmission line 4.

Figure 6:
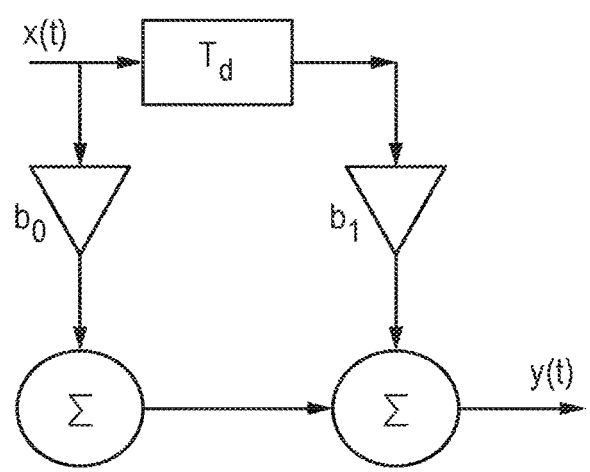
FIG. 6 shows an equivalent circuit for the embodiment shown in FIG. 5.

FIG. 6 shows an equivalent circuit for the embodiment shown and described above in relation to FIG. 5. As shown in FIG. 6, a delay time $T_d$ corresponds with the delay time of the cancellation signal which is governed by the propagation time along the transmission line 4. Various embodiments are contemplated wherein the length L of the transmission line 4 may be varied to reduce a reflection at a particular time after the signal from the ion detector or the signal peak. The magnitude of the reflections can be controlled by varying the impedance of the termination 5 which in effect allows control of the value of $b_1$ in the equivalent circuit shown in FIG. 6.

Embodiments are contemplated wherein multiple power splitter devices may be combined together in a number of different ways in order to emulate the multiple taps of a digital delayed filter with the advantage of providing greater flexibility in order to reduce Interferences caused by Impedance mismatches.

Figure 7:
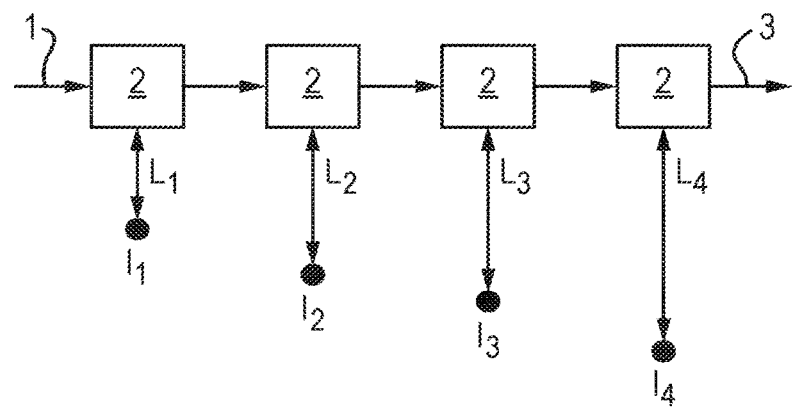
FIG. 7 shows a series of power splitters with different lengths of transmission lines according to an embodiment.

With this in mind, FIG. 7 shows another embodiment comprising a series of (or more generally a plurality of) power splitters or dividers 2 each having different lengths of transmission line $L_1$ to $L_4$ and each having different termination impedances $I_1$ to $I_4$.

The embodiment shown and described above with reference to FIG. 7 allows complex perturbations caused by multiple echoes in the signal path to be controlled. Each power splitter or divider 2 may have a different split ratio or the same ratio.

Although the particular embodiment shown in FIG. 7 comprises a series of four power splitters or dividers 2, it will be understood by those skilled in the art that a different number of power splitters or dividers 2 may be provided. For example, according to other embodiments 2, 3, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40 or >40 power splitters or dividers 2 may be provided.

Furthermore, although the embodiment shown in FIG. 7 comprises transmission lines $L_1$ to $L_4$ which are shown as all being of different lengths, other embodiments are contemplated wherein at least some of the transmission lines may have the same or substantially the same length.

Figure 8:
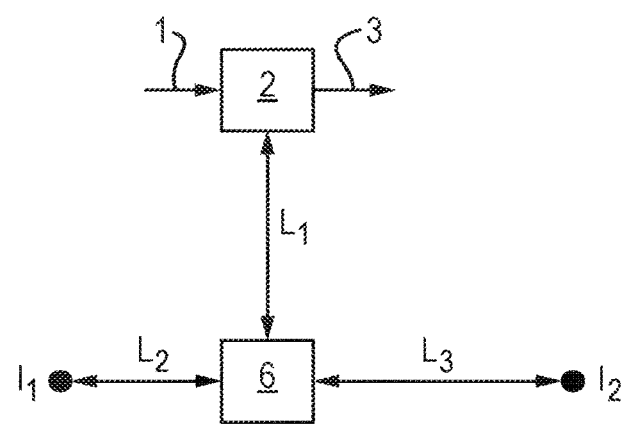
FIG. 8 shows an alternative embodiment wherein a second splitter Is placed at the end of a transmission line.

FIG. 8 shows an alternative embodiment wherein a second power splitter or divider 6 may be placed at the end of a transmission line $L_1$. Transmission lines of different length $L_2$ and $L_3$ may be attached to the other two ports of the second power splitter or divider 6 and may be terminated with impedances $I_1$ and $I_2$. This allows two reflections to be cancelled at delay times governed by the length of $(L_1+L_2)$ and $(L_1+L_3)$.

The various alternative embodiments shown and described above with reference to FIGS. 5-8 therefore relate to methods of mass spectrometry wherein a signal output from an ion detector is passed to one or more first power splitters or dividers. One or more first transmission lines may be attached to one or more ports of one or more of the first power splitters or dividers in order to reduce the effect of baseline perturbations, echoes or other distortions. A signal output from the one or more first power splitters or dividers may then be processed. A length of the one or more first transmission lines may be set to a length so as to reduce or cancel out baseline perturbations, echoes or ringing effects.

The one or more first transmission lines may have a length selected to reduce baseline perturbations, echoes or ringing effects at a fixed, known or predictable time and/or position relative to one or more ion peaks or one or more signal peaks.

The one or more first transmission lines may have a termination impedance selected to reduce baseline perturbations, echoes or ringing effects having a fixed, known or predictable amplitude relative to one or more ion peaks or one or more signal peaks.

As shown in FIG. 8, one or more second power splitters or dividers 6 may be provided, wherein the one or more second power splitters or dividers 6 are attached to the one or more first transmission lines $L_1$. As shown in FIG. 8, one or more second transmission lines $L_2$, $L_3$ may be attached to one or more ports of the one or more second power splitters or dividers 6.

Although only a single first power splitter or divider 2 and a single second power splitter or divider 6 is shown in FIG. 8, it should be understood that other embodiments are contemplated comprising multiple first power splitter or dividers 2 and/or multiple associated second power splitters or dividers 6.

The one or more second transmission lines $L_1$-$L_n$ may have a length selected to reduce baseline perturbations, echoes or ringing effects at a fixed, known or predictable time and/or position relative to one or more ion peaks or one or more signal peaks.

The one or more second transmission lines may have a termination impedance selected to reduce baseline perturbations, echoes or ringing effects having a fixed, known or predictable amplitude relative to one or more ion peaks or one or more signal peaks.

An Analogue to Digital Converter ("ADC") may be used to digitise the signal output from the one or more first power splitters or dividers or alternatively a Time to Digital Converter ("TDC") or other event counter may be used to process the signal output from the one or more first power splitters or dividers 2.

Accordingly, a mass spectrometer may be provided comprising an ion detector, one or more first power splitters or dividers with one or more first transmission lines attached to one or more ports of the one or more first power splitters or dividers in order to reduce the effect of baseline perturbations, echoes or ringing effects. A signal output from the detector is passed to the one or more first power splitters or dividers. An analogue to digital converter ("ADC") digitiser or a time to digital converter ("TDC") or other event counter may be provided which processes or digitises a signal output from the one or more first power splitters or dividers 2.

According to various embodiments a signal output from an ion detector may be digitised to provide a first digitised signal. A digital filter or an echo cancellation filter may be applied to the first digitised signal in order to reduce the effect of baseline perturbations, echoes or ringing effects. The digital filter or echo cancellation filter may comprise a finite impulse response ("FIR") filter.

According to another embodiment a first signal may be produced from ions arriving at a detector and a copy of the first signal may be produced. The copy of the first signal may then be subtracted from the first signal in order to produce a second signal with the aim of reducing the effect of baseline perturbations, echoes or ringing effects. The copy may be delayed in time and/or may be scaled in amplitude.

It should be understood that various different combinations of the different embodiments shown and described above with reference to FIGS. 1-8 are envisaged and contemplated. For example, one or more finite impulse response filters may be provided in combination with one or more first power splitters or dividers and wherein each first power splitter or divider may comprise one or more first transmission lines. Each of the one or more first transmission lines may lead to one or more second power splitters or dividers, wherein each second power splitter or divider may comprise one or more second transmission lines.

The various embodiments described above (particularly those embodiments shown and described with reference to FIGS. 5-8 above) which are concerned with controlling or minimising undesired baseline perturbations, echoes or ringing effects in an analogue signal from an ion detector prior to the ion signal being digitised, sampled or otherwise processed enable such methods to be used with event counters such as time to digital converters ("TDCs") as well as ADCs. This is not the case with a digital delay line as the signal must first be digitised prior to echo cancellation.

Although the present Invention has been described with reference to preferred embodiments, it will be understood by those skilled in the art that various changes in form and detail may be made without departing from the scope of the invention as set forth in the accompanying claims.

The invention claimed is:

1. A method of mass spectrometry comprising:
    passing a signal output from a detector to one or more first power splitters or dividers, wherein one or more first transmission lines are attached to one or more ports of one or more of said first power splitters or dividers in order to reduce the effect of baseline perturbations, echoes or ringing effects, wherein a reflection of a part of the signal transmitted down a first transmission line comprises a cancellation signal, wherein the cancellation signal has a time delay governed by the propagation time along the first transmission line, and wherein a length of the first transmission line is selected such that the cancellation signal substantially reduces or cancels a baseline perturbation in the signal output occurring at a fixed, known or predetermined time after a signal from a main ion signal; and
    processing a signal output from said one or more first power splitters or dividers.

2. A method as claimed in claim 1, wherein a length of said one or more first transmission lines is set to a length so as to reduce or cancel out baseline perturbations, echoes or ringing effects.

3. A method as claimed in claim 1, wherein said one or more first transmission lines have a length selected to reduce baseline perturbations, echoes or ringing effects at a fixed, known or predictable time and/or position relative to one or more ion peaks or one or more signal peaks.

4. A method as claimed in claim 1, wherein said one or more first transmission lines have a termination impedance selected to reduce baseline perturbations, echoes or ringing effects having a fixed, known or predictable amplitude relative to one or more ion peaks or one or more signal peaks.

5. A method as claimed in claim 1, wherein a magnitude of the cancellation signal is controlled or selected by varying or selecting a termination impedance of the first transmission line.

6. A method as claimed in claim 1, further comprising using an Analogue to Digital Converter ("ADC") to digitise said signal output from said one or more first power splitters or dividers or using a Time to Digital Converter ("TDC") or other event counter to process said signal output from said one or more first power splitters or dividers.

7. A method as claimed in claim 1, further comprising directing ions on to said detector, wherein said detector comprises an ion detector of a Time of Flight mass analyser.

8. A method as claimed in claim 1, wherein at least one of the one or more first power splitters comprises an unequal power splitter.

9. A method of mass spectrometry comprising:
    passing a signal output from a detector to one or more first power splitters or dividers, wherein one or more first transmission lines are attached to one or more ports of one or more of said first power splitters or dividers in order to reduce the effect of baseline perturbations, echoes or ringing effects, wherein at least one of said one or more first transmission lines has a length which is different from another of said one or more first transmission lines; and
    processing a signal output from said one or more first power splitters or dividers.

10. A method of mass spectrometry comprising:
    passing a signal output from a detector to one or more first power splitters or dividers, wherein one or more first transmission lines are attached to one or more ports of one or more of said first power splitters or dividers in order to reduce the effect of baseline perturbations, echoes or ringing effects, wherein a length and termination impedance of said one or more first transmission lines are arranged such that a reflection of a part of the signal transmitted down a first transmission line substantially cancels out a baseline perturbation appearing at a time after a main ion signal; and
    processing a signal output from said one or more first power splitters or dividers.

11. A method of mass spectrometry comprising:
    passing a signal output from a detector to one or more first power splitters or dividers, wherein one or more first transmission lines are attached to one or more ports of one or more of said first power splitters or dividers in order to reduce the effect of baseline perturbations, echoes or ringing effects;
    Providing one or more second power splitters or dividers, wherein said one or more second power splitters or dividers are attached to said one or more first transmission lines; and
    processing a signal output from said one or more first power splitters or dividers.

12. A method as claimed in claim 11, further comprising providing one or more second transmission lines attached to one or more ports of said one or more second power splitters or dividers.

13. A method as claimed in claim 12, wherein said one or more second transmission lines have a length selected to reduce baseline perturbations, echoes or ringing effects at a fixed, known or predictable time and/or position relative to one or more ion peaks or one or more signal peaks.

14. A method as claimed in claim 12, wherein a reflection of a part of the signal transmitted down both a first transmission line and a second transmission line which are attached by a same second power splitter of said one or more second power splitters comprises a cancellation signal, wherein the cancellation signal has a time delay governed by the propagation time along the first transmission line and the second transmission line.

15. A method as claimed in claim 12, wherein at least one of said one or more second transmission lines has a length which is different from another of said one or more second transmission lines.

16. A method as claimed in claim 12, wherein said one or more second transmission lines have a termination impedance selected to reduce baseline perturbations, echoes or ringing effects having a fixed, known or predictable amplitude relative to one or more ion peaks or one or more signal peaks.

17. A mass spectrometer comprising:
a detector;
one or more first power splitters or dividers;
one or more first transmission lines attached to one or more ports of said one or more first power splitters or dividers in order to reduce the effect of baseline perturbations, echoes or ringing effects; and
a device for processing a signal output from said one or more first power splitters or dividers;
wherein, in use, a signal output from said detector is passed to said one or more first power splitters or dividers, and wherein a reflection of a part of the signal transmitted down a first transmission line comprises a cancellation signal, wherein the cancellation signal has a time delay governed by the propagation time along the first transmission line, and wherein a length of the first transmission line is selected such that the cancellation signal substantially reduces or cancels a baseline perturbation in the signal output occurring at a fixed, known or predetermined time after a signal from a main ion signal.

18. A mass spectrometer as claimed in claim 17, wherein said device comprises an Analogue to Digital Converter ("ADC") or a Time to Digital Converter ("TDC") or other event counter.

19. A mass spectrometer as claimed in claim 17, wherein said detector comprises an ion detector of a Time of Flight mass analyser.

20. A mass spectrometer comprising;
a detector;
one or more first power splitters or dividers;
one or more first transmission lines attached to one or more ports of said one or more first power splitters or dividers in order to reduce the effect of baseline perturbations, echoes or ringing effects;
one or more second power splitters or dividers attached to said one or more transmission lines; and
a device for processing a signal output from said one or more first power splitters or dividers;
wherein, in use, a signal output from said detector is passed to said one or more first power splitters or dividers.

* * * * *